(12) United States Patent
Daimon et al.

(10) Patent No.: US 11,374,550 B2
(45) Date of Patent: Jun. 28, 2022

(54) ELASTIC WAVE DEVICE (71) Applicant: Murata Manufacturing Co., Ltd., Nagaokakyo (JP)

(72) Inventors: Katsuya Daimon, Nagaokakyo (JP); Daisuke Tamazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1077 days.

(21) Appl. No.: 15/983,315

(22) Filed: May 18, 2018

(65) Prior Publication Data
US 2018/0269852 A1    Sep. 20, 2018

Related U.S. Application Data (63) Continuation of application No. PCT/JP2016/087079, filed on Dec. 13, 2016.

(30) Foreign Application Priority Data

Dec. 25, 2015 (JP) ............................. JP2015-253657

(51) Int. Cl.
*H03H 9/02* (2006.01)
*H03H 9/145* (2006.01)
*H03H 9/25* (2006.01)

(52) U.S. Cl.
CPC .... *H03H 9/14541* (2013.01); *H03H 9/02559* (2013.01); *H03H 9/02834* (2013.01); *H03H 9/02858* (2013.01); *H03H 9/25* (2013.01)

(58) Field of Classification Search
CPC ............. H03H 9/14541; H03H 9/0559; H03H 9/02834; H03H 9/25

USPC ...... 310/313 R, 313 A, 313 B, 313 C, 313 D
See application file for complete search history.

(56) References Cited

U.S. PATENT DOCUMENTS

| 9,673,779 B2 * | 6/2017 | Ruile ................. H03H 9/02858 |
| 2011/0068655 A1 | 3/2011 | Solal et al. |
| 2013/0051588 A1 | 2/2013 | Ruile et al. |

(Continued)

FOREIGN PATENT DOCUMENTS

| JP | 2011-101350 A | 5/2011 |
| JP | 2012-186808 A | 9/2012 |
| JP | 2013-518455 A | 5/2013 |

(Continued)

OTHER PUBLICATIONS

Official Communication issued in International Patent Application No. PCT/JP2016/087079, dated Feb. 28, 2017.

*Primary Examiner* — Derek J Rosenau
(74) *Attorney, Agent, or Firm* — Keating & Bennett, LLP (57) ABSTRACT An elastic wave device includes first mass adding films provided on a first dielectric film to overlap with first and second electrodes fingers of an IDT electrode when seen from above, extend in a direction in which the first and second electrode fingers extend, and are provided in a center region, and second and third mass adding films that are provided on the first dielectric film and are provided in first and second edge regions, respectively, and a portion of which overlap with at least one of the first and second electrode fingers when seen from above. Dimensions of the second and third mass adding films along an elastic wave propagation direction are larger than a dimension of the first mass adding films along the elastic wave propagation direction.

19 Claims, 5 Drawing Sheets (56) References Cited

U.S. PATENT DOCUMENTS

2016/0149553 A1   5/2016   Yoon et al.

FOREIGN PATENT DOCUMENTS

| JP | 2013-138333 A | 7/2013 |
|---|---|---|
| WO | 2015/007319 A1 | 1/2015 |

* cited by examiner

ELASTIC WAVE DEVICE

CROSS REFERENCE TO RELATED APPLICATIONS

This application claims the benefit of priority to Japanese Patent Application No. 2015-253657 filed on Dec. 25, 2015 and is a Continuation Application of PCT Application No. PCT/JP2016/087079 filed on Dec. 13, 2016. The entire contents of each application are hereby incorporated herein by reference.

BACKGROUND OF THE INVENTION

1. Field of the Invention

The present invention relates to an elastic wave device using a piston mode.

2. Description of the Related Art

An existing elastic wave device using a piston mode has been proposed in order to suppress transverse mode spurious responses.

For example, Japanese Unexamined Patent Application Publication No. 2012-186808 describes an example of the elastic wave device using the piston mode. The elastic wave device has an intersection region in which a plurality of first electrode fingers and a plurality of second electrode fingers of an interdigital transducer (IDT) electrode overlap with each other when seen in an elastic wave propagation direction. The intersection region includes, in a direction in which the first and second electrode fingers extend, a center region and first and second edge regions provided in outer side portions of the center region in the direction in which the first and second electrode fingers extend.

In addition, a dielectric film is laminated on a piezoelectric substrate so as to cover the IDT electrode. Titanium layers are embedded in portions of the dielectric film, which are located in the first and second edge regions. With this, acoustic velocities in the first and second edge regions are lower than acoustic velocities in the center region and outer side regions of the first and second edge regions, thus suppressing the transverse mode spurious responses.

In a manufacturing process for providing the elastic wave device disclosed in Japanese Unexamined Patent Application Publication No. 2012-186808, the titanium layers need to be formed in the first and second edge regions. Therefore, a portion in the center region and portions in the first and second edge regions cannot be formed by the same process. This may generate large variations in a film thickness of the intersection region. Accordingly, there is a risk that the transverse mode spurious responses cannot be sufficiently suppressed.

SUMMARY OF THE INVENTION

Preferred embodiments of the present invention provide elastic wave devices each capable of decreasing the influence of variations in a film thickness in an intersection region of an IDT electrode and sufficiently reducing or preventing transverse mode spurious responses.

An elastic wave device according to a preferred embodiment of the present invention includes a piezoelectric substrate, and an IDT electrode that is provided on the piezoelectric substrate, wherein the IDT electrode includes first and second busbars opposing each other, a plurality of first electrode fingers one end of each which is connected to the first busbar, and a plurality of second electrode fingers one end of each which is connected to the second busbar, and the plurality of first and second electrode fingers are interdigitated with one another, and when a portion in which the first electrode fingers and the second electrode fingers overlap with each other in an elastic wave propagation direction is defined as an intersection region, the intersection region includes, in a direction in which the first and second electrode fingers extend, a center region located at a center or approximate center and first and second edge regions at both sides of the center region, the elastic wave device further including a first dielectric film that is provided on the piezoelectric substrate so as to cover the IDT electrode, a first mass adding film that is provided on the first dielectric film, extends along the direction in which the first and second electrode fingers extend, and is provided in the center region, and overlaps with the plurality of first and second electrode fingers when seen from above, a second mass adding film that is provided on the first dielectric film and in the first edge region, and a portion of which overlaps with at least one of the first and second electrode fingers when seen from above, and a third mass adding film that is provided on the first dielectric film and in the second edge region, and a portion of which overlaps with at least one of the first and second electrode fingers when seen from above, wherein dimensions of the second and third mass adding films along the elastic wave propagation direction are larger than a dimension of the first mass adding film along the elastic wave propagation direction.

In an elastic wave device according to a preferred embodiment of the present invention, when an acoustic velocity of elastic waves in the center region is V1, acoustic velocities of the elastic waves in the first and second edge regions are V2, and acoustic velocities of the elastic waves in regions located between the first edge region and the first busbar and between the second edge region and the second busbar are V3, V3>V1>V2 is satisfied. In this case, transverse mode spurious responses are further reduced or prevented.

In an elastic wave device according to a preferred embodiment of the present invention, densities of materials of the first to third mass adding films are higher than a density of a material of the IDT electrode. In this case, excitation efficiency of the IDT electrode is effectively improved.

In an elastic wave device according to a preferred embodiment of the present invention, the second and third mass adding films are respectively provided over entire or substantially entire lengths of the first and second edge regions in the elastic wave propagation direction. In this case, the acoustic velocities in the first and second edge regions are effectively lowered. Accordingly, the transverse mode spurious responses are further reduced or prevented.

In an elastic wave device according to a preferred embodiment of the present invention, the plurality of second mass adding films are disposed with gaps between the plurality of second mass adding films in the elastic wave propagation direction, and the respective second mass adding films overlap with the respective first and second electrode fingers over entire or substantially entire lengths of the respective first and second electrode fingers in the elastic wave propagation direction when seen from above, and the plurality of third mass adding films are disposed with gaps between the plurality of third mass adding films in the elastic wave propagation direction, and the respective third mass adding films overlap with the respective first and second electrode fingers over the entire or substantially the entire lengths of the respective first and second electrode fingers in the elastic wave propagation direction when seen from above. In this case, in a manufacturing process for providing the elastic wave device, the first to third mass adding films are able to be easily formed using a lift-off method. Therefore, productivity is improved.

In an elastic wave device according to a preferred embodiment of the present invention, the first mass adding film and the second and third mass adding films are continuous with each other.

In an elastic wave device according to a preferred embodiment of the present invention, the first mass adding film and the second and third mass adding films are disposed with gaps between the first mass adding film and the second and third mass adding films in a direction perpendicular or substantially perpendicular to the elastic wave propagation direction when seen from above.

In an elastic wave device according to a preferred embodiment of the present invention, the dimension of the first mass adding film along the elastic wave propagation direction is smaller than dimensions of the respective first and second electrode fingers along the elastic wave propagation direction. In this case, the acoustic velocity in the center region is difficult to be reduced. Accordingly, the transverse mode spurious responses are further reduced or prevented.

In an elastic wave device according to a preferred embodiment of the present invention, a second dielectric film that is laminated between the piezoelectric substrate and the IDT electrode is further included. In this case, an electromechanical coupling coefficient is able to be adjusted.

Elastic wave devices according to preferred embodiments of the present invention are able to decrease the influence of variations in a film thickness in an intersection region of an IDT electrode and sufficiently reduce or prevent transverse mode spurious responses.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

It is to be noted that the respective preferred embodiments which are described in the specification are examples and partial replacements or combinations of components may be made among different preferred embodiments.

Figure 1:
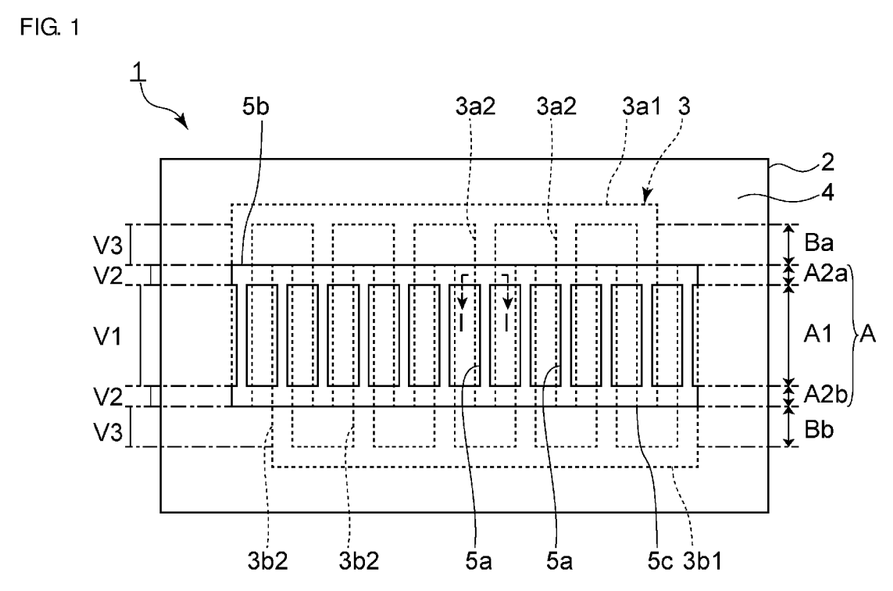
FIG. 1 is a plan view of an elastic wave device according to a first preferred embodiment of the present invention.
Figure 2:
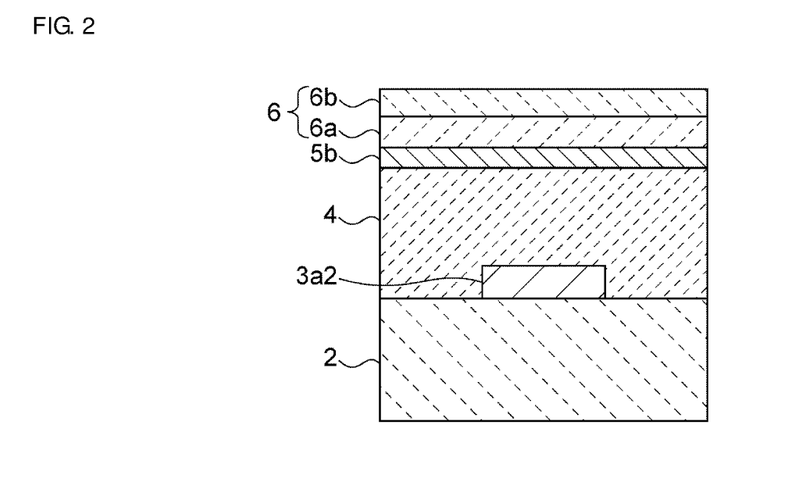
FIG. 2 is a cross-sectional view along line I-I in FIG. 1.

FIG. 1 is a plan view of an elastic wave device according to a first preferred embodiment of the present invention. FIG. 2 is a cross-sectional view along line I-I in FIG. 1. In FIG. 1, a dielectric film on first to third mass adding films, which will be described later, is omitted.

The elastic wave device 1 includes a piezoelectric substrate 2. The piezoelectric substrate 2 is preferably made of piezoelectric single crystal, such as $LiNbO_3$ and $LiTaO_3$ or appropriate piezoelectric ceramics, for example.

An IDT electrode 3 is provided on the piezoelectric substrate 2. The IDT electrode 3 includes first and second busbars 3$a$1 and 3$b$1 that oppose each other. The IDT electrode 3 includes a plurality of first electrode fingers 3$a$2 including one end of each that is connected to the first busbar 3$a$1. Furthermore, the IDT electrode 3 includes a plurality of second electrode fingers 3$b$2 including one end of each that is connected to the second busbar 3$b$1.

The plurality of first and second electrode fingers 3$a$2 and 3$b$2 are interdigitated with one another. A portion in which the first electrode fingers 3$a$2 and the second electrode fingers 3$b$2 overlap with each other in an elastic wave propagation direction is defined as an intersection region A. In this case, the intersection region A includes a center region A1 located at the center or approximate center in the direction in which the first and second electrode fingers 3a2 and 3b2 extend. The intersection region A also includes first and second edge regions A2a and A2b disposed at both sides of the center region A1 in the direction in which the first and second electrode fingers 3a2 and 3b2 extend. The first edge region A2a is located at the first busbar 3a1 side and the second edge region A2b is located at the second busbar 3b1 side.

The IDT electrode 3 includes first and second outer side regions Ba and Bb at the opposite side to the center region A1 with respect to the first and second edge regions A2a and A2b, respectively. The first outer side region Ba is located between the first edge region A2a and the first busbar 3a1. The second outer side region Bb is located between the second edge region A2b and the second busbar 3b1.

In the present preferred embodiment, the IDT electrode 3 is preferably made of Al, for example. It should be noted that the IDT electrode 3 may be made of an appropriate metal other than Al. The IDT electrode 3 may be defined by a single-layered metal film or by a multilayered metal film.

The elastic wave device 1 uses a piston mode. It is assumed that an acoustic velocity of elastic waves in the center region A1 is V1, acoustic velocities of the elastic waves in the first and second edge regions A2a and A2b are V2, and acoustic velocities of the elastic waves in the first and second outer side regions Ba and Bb are V3. In this case, it is preferable that V3>V1>V2 is satisfied. With this configuration, transverse mode spurious responses are effectively reduced or prevented. FIG. 1 illustrates the relationship among the acoustic velocities V1, V2, and V3. It should be noted that the acoustic velocity is higher towards the left side in FIG. 1.

As illustrated in FIG. 1, a first dielectric film 4 is provided on the piezoelectric substrate 2 so as to cover the IDT electrode 3. The first dielectric film 4 is preferably made of SiO$_2$, for example, although it is not particularly limited.

First to third mass adding films 5a to 5c are provided on the first dielectric film 4 so as to overlap with the first and second electrode fingers 3a2 and 3b2 when seen from above. To be more specific, the plurality of first mass adding films 5a are provided in the center region A1. The plurality of first mass adding films 5a extend along the direction in which the first and second electrode fingers 3a2 and 3b2 extend over an entire or substantially an entire length of the center region A1 in this direction. The plurality of first mass adding films 5a are provided with gaps therebetween in the elastic wave propagation direction. The plurality of first mass adding films 5a include the first mass adding films 5a overlapping with the first electrode fingers 3a2 and the first mass adding films 5a overlapping with the second electrode fingers 3b2 when seen from above. Dimensions of the respective first and second electrode fingers 3a2 and 3b2 and the respective first mass adding films 5a along the elastic wave propagation direction are defined as widths. In this case, in the present preferred embodiment, the width of each of the first mass adding films 5a is smaller than the width of each of the first and second electrode fingers 3a2 and 3b2.

The second mass adding film 5b is provided in the first edge region A2a. The second mass adding film 5b is disposed over the entire or substantially the entire length of the first edge region A2a in the elastic wave propagation direction.

The third mass adding film 5c is provided in the second edge region A2b. The third mass adding film 5c is disposed over the entire or substantially the entire length of the second edge region A2b in the elastic wave propagation direction. Thus, the dimensions of the second mass adding film 5b and the third mass adding film 5c along the elastic wave propagation direction are larger than the dimension of the first mass adding films 5a along the elastic wave propagation direction.

In the present preferred embodiment, the plurality of first mass adding films 5a and the second and third mass adding films 5b and 5c are preferably continuous with each other.

The first to third mass adding films 5a to 5c are preferably made of Pt, for example, in the present preferred embodiment. It should be noted that the first to third mass adding films 5a to 5c may be made of appropriate metal other than Pt. It is preferable that a density of a material of the first to third mass adding films 5a to 5c be higher than a density of a material of the IDT electrode 3. With this configuration, excitation efficiency of the IDT electrode 3 is effectively improved. The first to third mass adding films 5a to 5c may be defined by single-layered metal films or multilayered metal films.

As illustrated in FIG. 2, a dielectric layer 6 is provided on the first dielectric film 4. The dielectric layer 6 covers the first to third mass adding films 5a to 5c illustrated in FIG. 1. The dielectric layer 6 includes a first layer 6a located at the first dielectric film 4 side and a second layer 6b laminated on the first layer 6a. In this case, for example, preferably, the first layer 6a may be made of SiO$_2$ or other suitable material and the second layer 6b may be made of SiN or other suitable material. The dielectric layer 6 may be defined by a single layer.

Referring back to FIG. 1, in the present preferred embodiment, the first to third mass adding films 5a to 5c overlap with the intersection region A of the IDT electrode 3 when seen from above. With this configuration, an influence by variations in a film thickness in the intersection region A of the IDT electrode 3 is decreased. Furthermore, the transverse mode spurious response is sufficiently reduced or prevented.

As illustrated in FIG. 1, a portion of the IDT electrode 3, which is located in the first outer side region Ba, corresponds to only the first electrode fingers 3a2. A portion of the IDT electrode 3, which is located in the second outer side region Bb, corresponds to only the second electrode fingers 3b2. In addition, the acoustic velocity in the intersection region A is reduced because the first to third mass adding films 5a to 5c are provided therein. Accordingly, in the elastic wave device 1, V3>V1 and V3>V2 are preferably satisfied.

In the center region A1, the plurality of first mass adding films 5a are provided with the gaps therebetween in the elastic wave propagation direction. In contrast, in the first and second edge regions A2a and A2b, the second and third mass adding films 5b and 5c are provided over the entire or substantially the entire length of the intersection region A in the elastic wave propagation direction. With this configuration, the areas of the second and third mass adding films 5b and 5c in the respective first and second edge regions A2a and A2b are increased. Therefore, masses that are added to the IDT electrode 3 are able to be increased in the first and second edge regions A2a and A2b. This increase enables the acoustic velocity V2 in the first and second edge regions A2a and A2b to be effectively reduced. With this configuration, V1>V2 is able to be satisfied and a difference between the acoustic velocity V1 and the acoustic velocity V2 is able to be increased. Accordingly, the transverse mode spurious responses are effectively reduced or prevented.

Advantageous effects of the first preferred embodiment are further described with reference to FIG. 3 to FIG. 5. Dimensions of the second and third mass adding films 5b and 5c in the direction perpendicular or substantially perpendicular to the elastic wave propagation direction are defined as widths of the second and third mass adding films 5b and 5c. In the first preferred embodiment, the widths of the second and third mass adding films 5b and 5c are preferably the same as each other.

Figure 3:
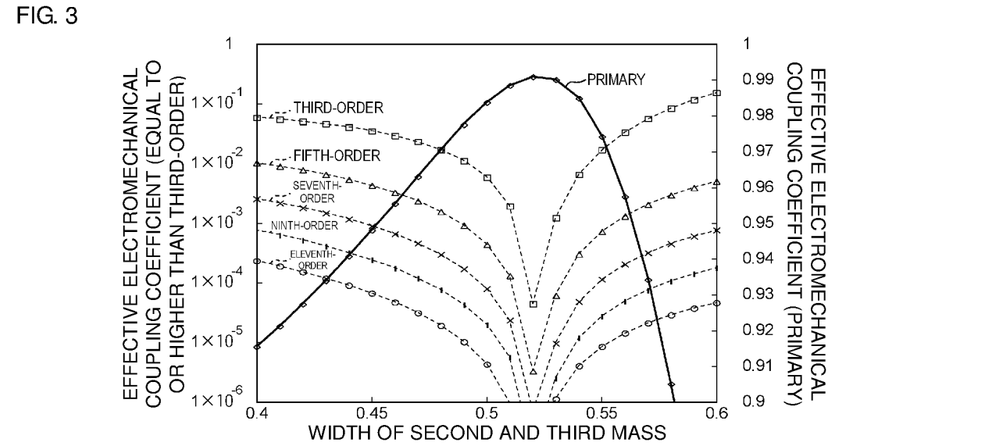
FIG. 3 is a graph illustrating relationships between a width of second and third mass adding films and primary and high-order effective electromechanical coupling coefficients when film thicknesses of first to third mass adding films are set to about 95 nm in the elastic wave device in the first preferred embodiment of the present invention.

FIG. 3 is a graph illustrating relationships between the width of the second and third mass adding films and primary and higher-order effective electromechanical coupling coefficients when film thicknesses of the first to third mass adding films are set to about 95 nm in the elastic wave device in the first preferred embodiment. FIG. 4 is a graph illustrating relationships between the width of the second and third mass adding films and the primary and higher-order effective electromechanical coupling coefficients when the film thicknesses of the first to third mass adding films are set to about 70 nm in the elastic wave device in the first preferred embodiment. FIG. 5 is a graph illustrating relations between the width of the second and third mass adding films and the primary and higher-order effective electromechanical coupling coefficients when the film thicknesses of the first to third mass adding films are set to about 120 nm in the elastic wave device in the first preferred embodiment. It should be noted that a film thickness of the IDT electrode is preferably set to about 20 nm, for example, when the relationships illustrated in FIG. 3 to FIG. 5 are obtained.

A rhombic plot and a solid line in each of FIG. 3 to FIG. indicate the primary effective electromechanical coupling coefficient. A rectangular plot and a dashed line indicate a third-order effective electromechanical coupling coefficient. A triangular plot and a dashed line indicate a fifth-order effective electromechanical coupling coefficient. An X-shaped plot and a dashed line indicate a seventh-order effective electromechanical coupling coefficient. An I-shaped plot and a dashed line indicate a ninth-order effective electromechanical coupling coefficient. A circular plot and a dashed line indicate an eleventh-order effective electromechanical coupling coefficient. The longitudinal axis at the right side indicates values of the primary effective electromechanical coupling coefficient and a longitudinal axis at the left side indicates values of the effective electromechanical coupling coefficients of equal to or higher than third order. The above-described relationships between the plot shapes and line types and the respective orders are the same as those in each of FIG. 6 to FIG. 8, which will be described below.

In the result illustrated in FIG. 3, the width of the second and third mass adding films with which the primary effective electromechanical coupling coefficient is a maximum value and the width of the second and third mass adding films with which the effective electromechanical coupling coefficients of equal to or higher than third order are minimum values are the same or substantially the same widths. Accordingly, energy efficiency is effectively improved and the transverse mode spurious responses are effectively reduced or prevented.

Figure 4:
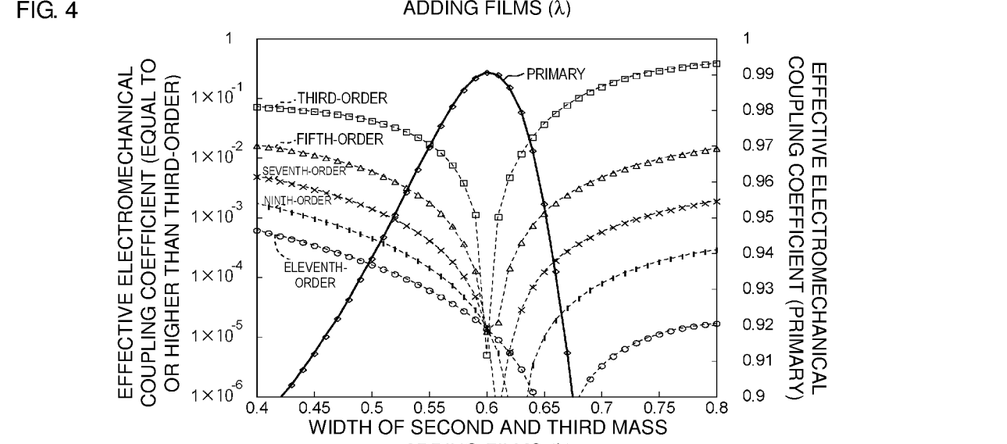
FIG. 4 is a graph illustrating relationships between the width of the second and third mass adding films and the primary and high-order effective electromechanical coupling coefficients when the film thicknesses of the first to third mass adding films are set to about 70 nm in the elastic wave device in the first preferred embodiment of the present invention.

A result illustrated in FIG. 4 is provided when the film thicknesses of the first to third mass adding films, which derive the relationships illustrated in FIG. 3, are reduced by about 25 nm. Also in this case, the width of the second and third mass adding films with which the primary effective electromechanical coupling coefficient is a maximum value and the width of the second and third mass adding films with which the effective electromechanical coupling coefficients of equal to or higher than third order are minimum values are slightly deviated from each other.

Figure 5:
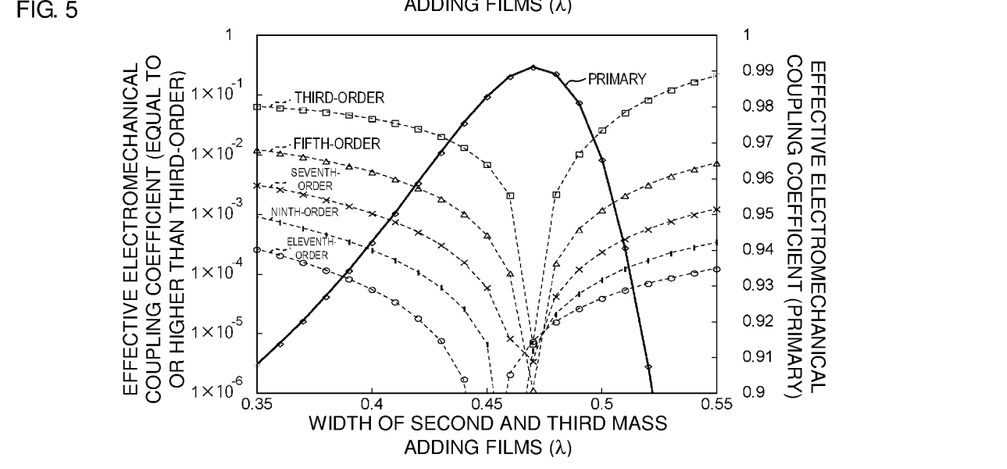
FIG. 5 is a graph illustrating relationships between the width of the second and third mass adding films and the primary and high-order effective electromechanical coupling coefficients when the film thicknesses of the first to third mass adding films are set to about 120 nm in the elastic wave device in the first preferred embodiment of the present invention.

A result illustrated in FIG. 5 is provided when the film thicknesses of the first to third mass adding films, which derive the relationships illustrated in FIG. 3, are increased by about 25 nm. Also in this case, the width of the second and third mass adding films with which the primary effective electromechanical coupling coefficient is a maximum value and the width of the second and third mass adding films with which the effective electromechanical coupling coefficients of equal to or higher than third order are minimum values are slightly deviated from each other.

As described above, in a wide range in which the film thicknesses of the first to third mass adding films are about 95 nm±25 nm, the transverse mode spurious responses are effectively reduced or prevented. Accordingly, the influence by variations in the film thicknesses of the first to third mass adding films are able to be decreased so as to decrease the influence by the variations in the film thickness in the intersection region A of the IDT electrode.

Next, advantageous effects of the first preferred embodiment will be described by comparing the first preferred embodiment and a comparative example. An elastic wave device in the comparative example is different from that in the first preferred embodiment in that the IDT electrode is made of Pt and the first mass adding film is not included.

Figure 6:
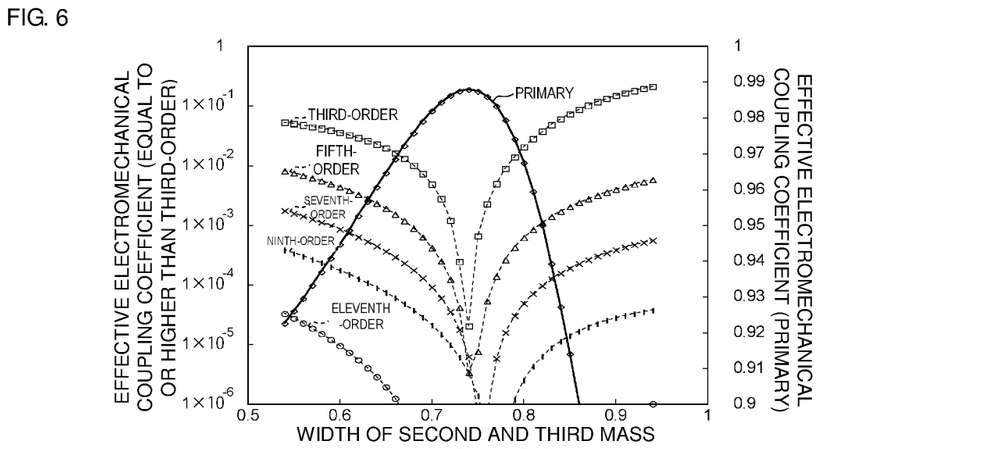
FIG. 6 is a graph illustrating relationships between the width of the second and third mass adding films and the primary and high-order effective electromechanical coupling coefficients when the film thicknesses of the second and third mass adding films are set to about 6 nm in the elastic wave device in a comparative example.
Figure 7:
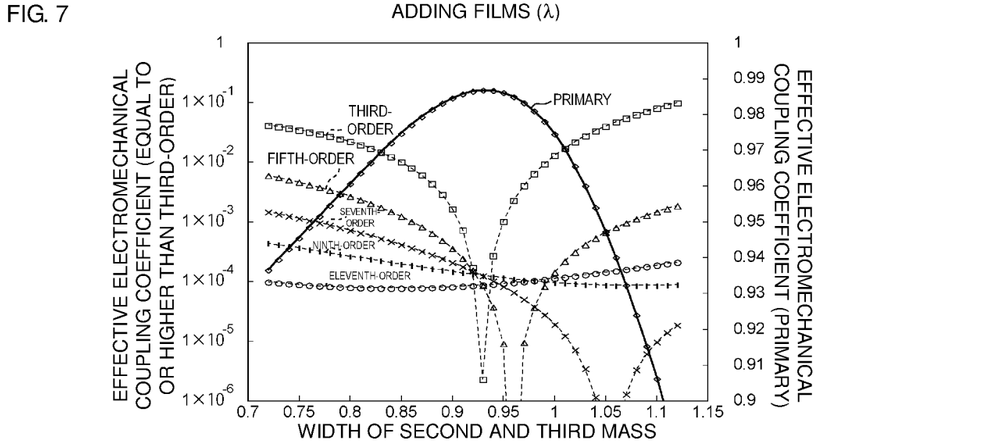
FIG. 7 is a graph illustrating relationships between the width of the second and third mass adding films and the primary and high-order effective electromechanical coupling coefficients when the film thicknesses of the second and third mass adding films are set to about 4.5 nm in the elastic wave device in the comparative example.
Figure 8:
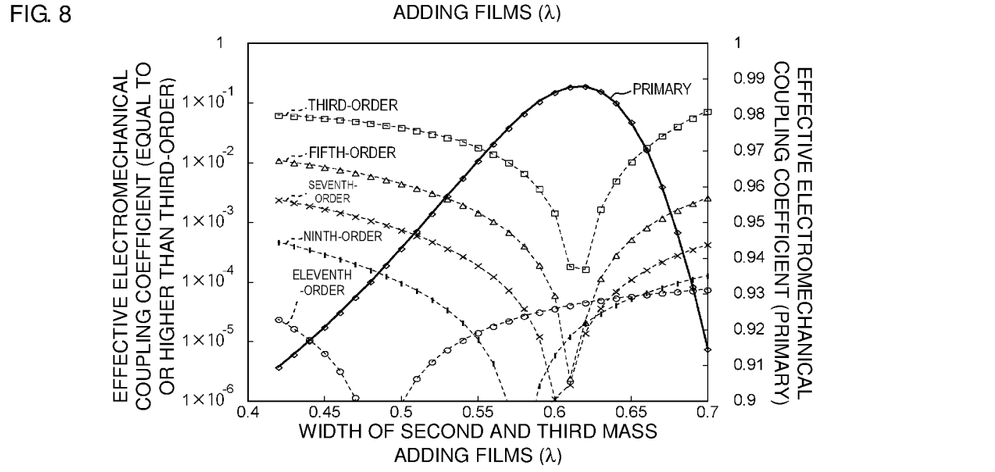
FIG. 8 is a graph illustrating relationships between the width of the second and third mass adding films and the primary and high-order effective electromechanical coupling coefficients when the film thicknesses of the second and third mass adding films are set to about 7.5 nm in the elastic wave device in the comparative example.

FIG. 6 is a graph illustrating relationships between the width of the second and third mass adding films and the primary and higher-order effective electromechanical coupling coefficients when the film thicknesses of the second and third mass adding films are set to about 6 nm in the elastic wave device in the comparative example. FIG. 7 is a graph illustrating relationships between the width of the second and third mass adding films and the primary and higher-order effective electromechanical coupling coefficients when the film thicknesses of the second and third mass adding films are set to about 4.5 nm in the elastic wave device in the comparative example. FIG. 8 is a graph illustrating relationships between the width of the second and third mass adding films and the primary and higher-order effective electromechanical coupling coefficients when the film thicknesses of the second and third mass adding films are set to about 7.5 nm in the elastic wave device in the comparative example. It should be noted that the film thickness of the IDT electrode is set to about 20 nm when the relations illustrated in FIG. 6 to FIG. 8 are obtained.

In the result of the comparative example, which is illustrated in FIG. 6, the width of the second and third mass adding films with which the primary effective electromechanical coupling coefficient is a maximum value and the width of the second and third mass adding films with which the effective electromechanical coupling coefficients of equal to or higher than third order are minimum values are slightly deviated from each other. However, in results illustrated in FIG. 7 and FIG. 8, the width of the second and third mass adding films with which the primary effective electromechanical coupling coefficient is a maximum value and the width of the second and third mass adding films with which the effective electromechanical coupling coefficients of equal to or higher than third order are minimum values are largely deviated from each other. Furthermore, in a result, which is illustrated in FIG. 7, changes in the effective electromechanical coupling coefficients of equal to or higher than ninth order are reduced.

The result illustrated in FIG. 7 is provided when the film thicknesses of the second and third mass adding films, which derive the relationships illustrated in FIG. 6, are reduced by about 1.5 nm. The result illustrated in FIG. 8 is provided when the film thicknesses of the second and third mass adding films, which derive the relationships illustrated in FIG. 6, are increased by about 1.5 nm. As described above, in the comparative example, even in a narrow range in which the film thicknesses of the second and third mass adding films are about 6 nm±1.5 nm, the influence by the variations in the film thicknesses is large.

As illustrated in FIG. 3 to FIG. 5, the elastic wave device in the first preferred embodiment is able to decrease the influence by the variations in the film thicknesses of the first to third mass adding films more effectively in a more than 10-fold wider range of the film thicknesses than that in the comparative example.

The following Table 1 indicates a relationship between V2/V1 and the film thickness of the IDT electrode in the first preferred embodiment. V2/V1 is a ratio of the acoustic velocity V2 in the first and second edge regions relative to the acoustic velocity V1 in the center region. It should be noted that the film thicknesses of the first to third mass adding films are set to about 80 nm. In the same or similar manner, Table 1 indicates a relationship between V2/V1 and the film thickness of the IDT electrode in the comparative example. It should be noted that the film thicknesses of the second and third mass adding films in the comparative example are set to about 10 nm.

TABLE 1

| FILM THICKNESS OF IDT ELECTRODE (nm) | V2/V1 FIRST PREFERRED EMBODIMENT | V2/V1 COMPARATIVE EXAMPLE |
| --- | --- | --- |
| 10 | 0.967 | 0.967 |
| 20 | 0.967 | 0.969 |
| 30 | 0.967 | 0.971 |
| 40 | 0.967 | 0.973 |
| 50 | 0.967 | 0.974 |
| 60 | 0.967 | 0.976 |
| 70 | 0.967 | 0.977 |

As indicated in Table 1, in the comparative example, V2/V1 varies because the film thickness of the IDT electrode varies. On the other hand, it is known that in the first preferred embodiment, the variations in the film thickness of the IDT electrode only slightly influence V2/V1. Accordingly, the first preferred embodiment is able to further decrease the influence by the variations in the film thickness in the intersection region of the IDT electrode.

Referring back to FIG. 1, in the first preferred embodiment, the plurality of first mass adding films 5a opposing the plurality of first and second electrode fingers 3a2 and 3b2 with the first dielectric film 4 interposed therebetween are provided, so as to effectively improve excitation efficiency of the IDT electrode 3. In addition, in the first preferred embodiment, as illustrated in FIG. 1, the width of each of the first mass adding films 5a is preferably smaller than the width of each of the first and second electrode fingers 3a2 and 3b2. With this configuration, it is difficult to reduce the acoustic velocity V1 in the center region A1. Accordingly, the difference between the acoustic velocity V1 and the acoustic velocity V2 is able to be further increased, so as to further reduce or prevent the transverse mode spurious responses.

As described above, the acoustic velocities in the first and second edge regions A2a and A2b are reduced because the second and third mass adding films 5b and 5c are provided therein. Therefore, the widths of the first and second electrode fingers 3a2 and 3b2 of the IDT electrode 3 need not to be increased in the first and second edge regions A2a and A2b. Accordingly, resistance to electrostatic breakdown when a voltage is applied thereto is also able to be improved.

As described above, the elastic wave device 1 according to the first preferred embodiment includes the first dielectric film 4 preferably made of SiO$_2$, for example. The first dielectric film 4 is able to decrease an absolute value of a temperature coefficient of frequency (TCF). Therefore, temperature characteristics of the elastic wave device 1 are improved. It should be noted that the first dielectric film 4 may be made of an appropriate material, such as SiN, SiON, and tantalum pentoxide, for example.

The dielectric layer 6 illustrated in FIG. 2 preferably includes SiN, for example. With this configuration, a frequency of the elastic waves that the elastic wave device 1 uses is able to be adjusted. It should be noted that the dielectric layer 6 may not necessarily be provided.

Also in the first to fourth variations of the first preferred embodiment, which are illustrated in FIG. 9 to FIG. 12, the influence by the variations in the film thickness in the intersection region of the IDT electrode is able to be decreased. Furthermore, the transverse mode spurious responses are sufficiently reduced or prevented.

Figure 9:
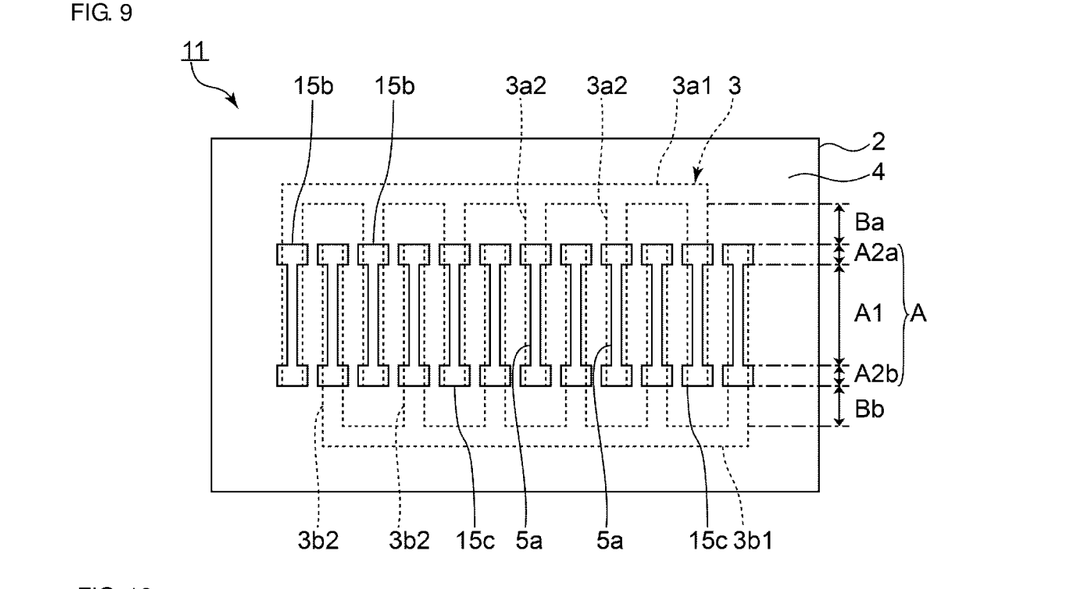
FIG. 9 is a plan view of an elastic wave device according to a first variation of the first preferred embodiment of the present invention.

In the first variation of the first preferred embodiment, which is illustrated in FIG. 9, a plurality of second and third mass adding films 15b and 15c may be included. The plurality of second mass adding films 15b are disposed with gaps therebetween in the elastic wave propagation direction. The plurality of third mass adding films 15c are also disposed with gaps therebetween in the elastic wave propagation direction. In this case, in a process for manufacturing an elastic wave device 11, the first mass adding films 5a and the second and third mass adding films 15b and 15c are able to be easily formed using a lift-off method. Therefore, productivity is able to be improved.

To be more specific, in the process for manufacturing the elastic wave device 11, a resist layer for forming the first mass adding films 5a and the plurality of second and third mass adding films 15b and 15c is formed on the first dielectric film 4. Thereafter, the resist layer is patterned.

In this case, the resist layer is also formed in portions corresponding to the gaps between the respective second and third mass adding films 15b and 15c in the elastic wave propagation direction. With this, a portion of the resist layer, which overlaps with the center region A1 of the IDT electrode 3 when seen from above, and a portion of the resist layer, which overlaps with the first and second outer side regions Ba and Bb when seen from above, are connected to each other.

Subsequently, a metal film forming the first mass adding films 5a and the plurality of second and third mass adding films 15b and 15c is formed on the first dielectric film 4. Then, the resist layer is removed. In this case, the resist layer is able to be easily removed because the resist layer has a connected pattern as described above.

It is sufficient that a portion of the second or third mass adding films 15b and 15c overlaps with at least one of the first and second electrode fingers 3a2 and 3b2 when seen from above.

Figure 10:
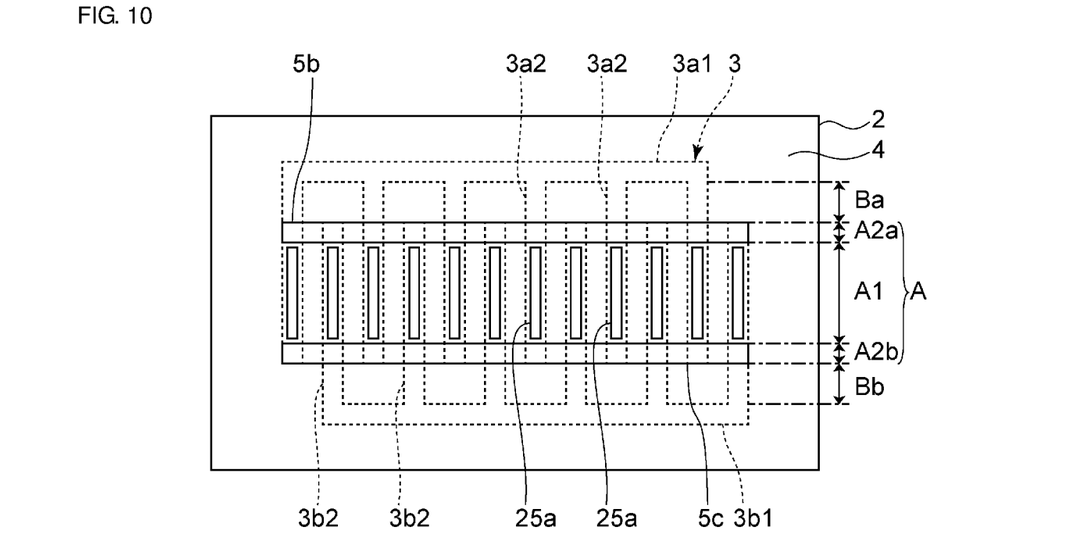
FIG. 10 is a plan view of an elastic wave device according to a second variation of the first preferred embodiment of the present invention.

In the second variation of the first preferred embodiment, which is illustrated in FIG. 10, first mass adding films 25a and the second and third mass adding films 5b and 5c may be disposed with gaps therebetween in the direction perpendicular or substantially perpendicular to the elastic wave propagation direction when seen from above.

Figure 11:
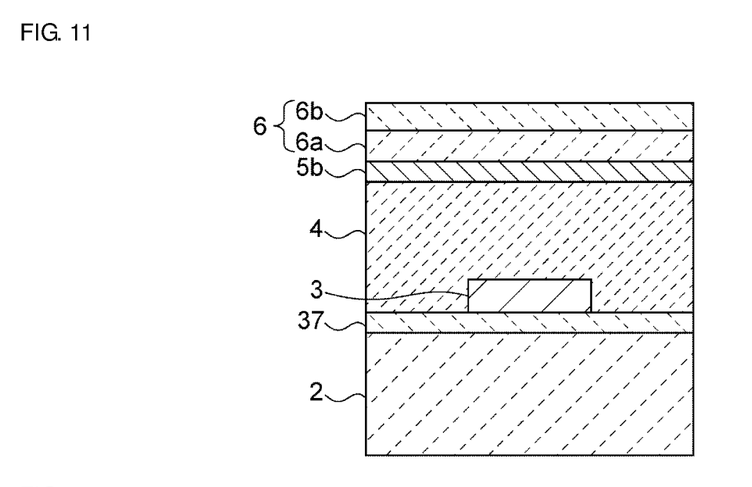
FIG. 11 is an enlarged front cross-sectional view of an elastic wave device according to a third variation of the first preferred embodiment of the present invention.

In the third variation of the first preferred embodiment, which is illustrated in FIG. 11, a second dielectric film 37 may be laminated between the piezoelectric substrate 2 and the IDT electrode 3. The second dielectric film 37 is preferably made of $SiO_2$, SiN, or other suitable material, for example, although it is not particularly limited.

In the elastic wave device in the third variation, the electromechanical coupling coefficient is able to be adjusted by providing the second dielectric film 37.

Figure 12:
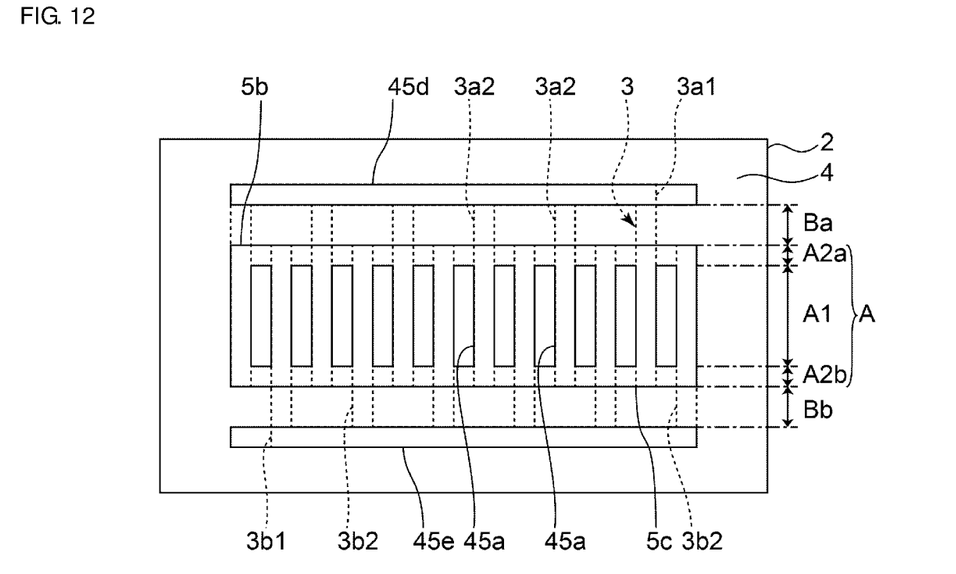
FIG. 12 is a plan view of an elastic wave device according to a fourth variation of the first preferred embodiment of the present invention.

In the fourth variation of the first preferred embodiment, which is illustrated in FIG. 12, first mass adding films 45a may preferably have the same or substantially the same width as the widths of the first and second electrode fingers 3a2 and 3b2 of the IDT electrode 3. Furthermore, a fourth mass adding film 45d may be provided on the first dielectric film 4 so as to overlap with at least a portion of the first busbar 3a1 when seen from above. A fifth mass adding film 45e may be provided on the first dielectric film 4 so as to overlap with at least a portion of the second busbar 3b1 when seen from above. For example, the fourth and fifth mass adding films 45d and 45e may preferably be provided so as to overlap with the entire or substantially the entire length of the intersection region A in the elastic wave propagation direction when seen from the direction in which the first and second electrode fingers 3a2 and 3b2 extend.

Preferred embodiments of the present invention may preferably be applied to elastic wave resonators, band pass filters, and other suitable devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate; and
   an IDT electrode provided on the piezoelectric substrate; wherein
   the IDT electrode includes first and second busbars opposing each other, a plurality of first electrode fingers each connected to the first busbar, and a plurality of second electrode fingers each connected to the second busbar; and
   the plurality of first and second electrode fingers are interdigitated with each other, and when a portion in which the first electrode fingers and the second electrode fingers overlap with each other in an elastic wave propagation direction is defined as an intersection region, the intersection region includes, in a direction in which the first and second electrode fingers extend, a center region located at a center or approximate center and first and second edge regions arranged at both sides of the center region;
   the elastic wave device further includes:
     a first dielectric film that is provided on the piezoelectric substrate so as to cover the IDT electrode;
     a first mass adding film that is provided on the first dielectric film, extends along the direction in which the first and second electrode fingers extend, and is provided in the center region, and overlaps with the plurality of first and second electrode fingers when seen from above;
     a second mass adding film that is provided on the first dielectric film and is provided in the first edge region, and a portion of which overlaps with at least one of the first and second electrode fingers when seen from above; and
     a third mass adding film that is provided on the first dielectric film and is provided in the second edge region, and a portion of which overlaps with at least one of the first and second electrode fingers when seen from above; wherein
   dimensions of the second and third mass adding films along the elastic wave propagation direction are larger than a dimension of the first mass adding film along the elastic wave propagation direction.

2. The elastic wave device according to claim 1, wherein when an acoustic velocity of elastic waves in the center region is V1, acoustic velocities of the elastic waves in the first and second edge regions are V2, and acoustic velocities of the elastic waves in regions located between the first edge region and the first busbar and between the second edge region and the second busbar are V3, V3>V1>V2 is satisfied.

3. The elastic wave device according to claim 1, wherein densities of materials of the first, second and third mass adding films are higher than a density of a material of the IDT electrode.

4. The elastic wave device according to claim 1, wherein the second and third mass adding films are respectively provided over entire or substantially entire lengths of the first and second edge regions in the elastic wave propagation direction.

5. The elastic wave device according to claim 1, wherein
   a plurality of the second mass adding films are provided and arranged with gaps between the plurality of second mass adding films in the elastic wave propagation direction, and the plurality of second mass adding films overlap with respective first and second electrode fingers over entire or substantially entire lengths of the respective first and second electrode fingers in the elastic wave propagation direction when seen from above; and
   a plurality of the third mass adding films are provided and arranged with gaps between the plurality of third mass adding films in the elastic wave propagation direction, and the plurality of third mass adding films overlap with the respective first and second electrode fingers over the entire or substantially the entire lengths of the respective first and second electrode fingers in the elastic wave propagation direction when seen from above.

6. The elastic wave device according to claim 1, wherein the first mass adding film and the second and third mass adding films are continuous with each other.

7. The elastic wave device according to claim 1, wherein the first mass adding film and the second and third mass adding films are arranged with gaps between the first mass adding film and the second and third mass adding films in a direction perpendicular or substantially perpendicular to the elastic wave propagation direction when seen from above.

8. The elastic wave device according to claim 1, wherein the dimension of the first mass adding film along the elastic wave propagation direction is less than dimensions of the respective first and second electrode fingers along the elastic wave propagation direction.

9. The elastic wave device according to claim 1, further including a second dielectric film that is laminated between the piezoelectric substrate and the IDT electrode.

10. The elastic wave device according to claim 1, wherein the piezoelectric substrate is made of a piezoelectric single crystal or a piezoelectric ceramic.

11. The elastic wave device according to claim 1, wherein the piezoelectric substrate is made of $LiNbO_3$ or $LiTaO_3$.

12. The elastic wave device according to claim 1, wherein the IDT electrode is made of Al.

13. The elastic wave device according to claim 1, wherein the IDT electrode is defined by a single-layered metal film.

14. The elastic wave device according to claim 1, wherein the IDT electrode is defined by a multilayered metal film.

15. The elastic wave device according to claim 1, wherein the first dielectric film is made of $SiO_2$.

16. The elastic wave device according to claim 1, wherein the first, second, and third mass adding films are made of Pt.

17. The elastic wave device according to claim 1, wherein a dielectric layer is provided on the first dielectric film and covers the first, second, and third mass adding films.

18. The elastic wave device according to claim 17, wherein the dielectric layer includes a first layer disposed on the first dielectric layer and a second layer disposed on a side of the first layer opposite to the first dielectric layer.

19. The elastic wave device according to claim 18, wherein the first layer is made of $SiO_2$ and the second layer is made of SiN.

\* \* \* \* \*